(12) United States Patent
Eimitsu (10) Patent No.: US 10,880,129 B2
(45) Date of Patent: Dec. 29, 2020

(54) SEMICONDUCTOR INTEGRATED CIRCUIT AND RECEPTION DEVICE

(71) Applicant: TOSHIBA MEMORY CORPORATION, Minato-ku (JP)

(72) Inventor: Masatomo Eimitsu, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/560,258

(22) Filed: Sep. 4, 2019

(65) Prior Publication Data
US 2020/0304351 A1    Sep. 24, 2020

(30) Foreign Application Priority Data
Mar. 19, 2019  (JP) .................. 2019-050998

(51) Int. Cl.
| H03H 7/30 | (2006.01) |
|---|---|
| H04L 25/03 | (2006.01) |
| H03K 5/135 | (2006.01) |
| H03K 5/00 | (2006.01) |

(52) U.S. Cl.
CPC ....... *H04L 25/03057* (2013.01); *H03K 5/135* (2013.01); *H04L 25/03025* (2013.01); *H03K 2005/00019* (2013.01); *H03K 2005/00078* (2013.01)

(58) Field of Classification Search
CPC ........ H04L 25/03057; H04L 25/03025; H03K 5/135; H03K 2005/00019; H03K 2005/00078

USPC ......................................................... 375/233
See application file for complete search history.

(56) References Cited

U.S. PATENT DOCUMENTS

| 5,451,894 | A | * | 9/1995 | Guo ..................... | H03K 5/131 327/241 |
|---|---|---|---|---|---|
| 8,054,876 | B2 | * | 11/2011 | Tsai ...................... | H03H 11/28 333/18 |
| 8,325,792 | B2 | | 12/2012 | Sunaga et al. | |
| 2015/0229314 | A1 | * | 8/2015 | Hata ...................... | H03K 3/012 327/218 |
| 2016/0056980 | A1 | * | 2/2016 | Wang .................... | H03L 7/087 375/233 |
| 2018/0083607 | A1 | | 3/2018 | Kanomata | |

(Continued)

FOREIGN PATENT DOCUMENTS

| JP | 2008-227980 A | 9/2008 |
|---|---|---|
| JP | 2009-225018 A | 10/2009 |
| JP | 2018-46489 A | 3/2018 |

Primary Examiner — Helene E Tayong
(74) Attorney, Agent, or Firm — Oblon, McClelland, Maier & Neustadt, L.L.P.

(57) ABSTRACT

According to one embodiment, in a semiconductor integrated circuit, a variable delay circuit is electrically connected to the correction circuit and configured to change a delay amount of the second clock. An adjustment circuit is electrically connected to a summer circuit. The adjustment circuit is configured to perform sampling of values in a plurality of edge periods and values in a plurality of data periods of data output from the summer circuit, and adjust a delay amount of the variable delay circuit such that timing of the second clock supplied from the variable delay circuit to the correction circuit becomes close to target timing according to a plurality of sampling results.

18 Claims, 9 Drawing Sheets

(56) References Cited

U.S. PATENT DOCUMENTS

2019/0149315 A1\* 5/2019 Suzuki .............. H04L 25/03146
375/233

\* cited by examiner

| D3 | D2 | E1 | D1 | E0 | D0 | DETERMI-NATION |
|---|---|---|---|---|---|---|
| 0 | 0 | 0 | 1 | 0 | 0 | Fast |
| 0 | 0 | 1 | 1 | 0 | 0 | Stay |
| 0 | 0 | 0 | 1 | 1 | 0 | Stay |
| 0 | 0 | 1 | 1 | 1 | 0 | Slow |

FIG.6B

| D3 | D2 | E1 | D1 | E0 | D0 | DETERMI-NATION |
|---|---|---|---|---|---|---|
| 0 | 0 | 0 | 1 | 0 | 0 | Stay |
| 0 | 0 | 1 | 1 | 0 | 0 | Early |
| 0 | 0 | 0 | 1 | 1 | 0 | Late |
| 0 | 0 | 1 | 1 | 1 | 0 | Stay |

| D4 | D3 | D2 | E1 | D1 | E0 | D0 | DETERMI-NATION |
|----|----|----|----|----|----|----|----------------|
| 0  | 0  | 0  | 0  | 1  | 0  | 0  | Fast |
| 0  | 0  | 0  | 1  | 1  | 0  | 0  | Stay |
| 0  | 0  | 0  | 0  | 1  | 1  | 0  | Stay |
| 0  | 0  | 0  | 1  | 1  | 1  | 0  | Slow |

FIG.9B

| D4 | D3 | D2 | E1 | D1 | E0 | D0 | DETERMI-NATION |
|----|----|----|----|----|----|----|----------------|
| 0  | 0  | 0  | 0  | 1  | 0  | 0  | Stay |
| 0  | 0  | 0  | 1  | 1  | 0  | 0  | Early |
| 0  | 0  | 0  | 0  | 1  | 1  | 0  | Late |
| 0  | 0  | 0  | 1  | 1  | 1  | 0  | Stay |

US 10,880,129 B2

SEMICONDUCTOR INTEGRATED CIRCUIT AND RECEPTION DEVICE

CROSS-REFERENCE TO RELATED APPLICATIONS

This application is based upon and claims the benefit of priority from Japanese Patent Application No. 2019-050998, filed on Mar. 19, 2019; the entire contents of which are incorporated herein by reference.

FIELD

Embodiments described herein relate generally to a semiconductor integrated circuit and a reception device.

BACKGROUND

In a communication system, there is a case where a transmission device and a reception device are connected by a wired communication path and wired communication is performed. Here, it is desired to appropriately perform the wired communication.

DETAILED DESCRIPTION

In general, according to one embodiment, there is provided A semiconductor integrated circuit comprises a clock generation circuit configured to generate a first clock, and an equalizer circuit. The equalizer circuit comprises a summer circuit, a correction circuit, a variable delay circuit, and an adjustment circuit. The correction circuit is electrically connected to the summer circuit and configured to be supplied a second clock on the basis of the first clock. The variable delay circuit is electrically connected to the correction circuit and configured to change a delay amount of the second clock. The adjustment circuit is electrically connected to the summer circuit. The adjustment circuit is configured to perform sampling of values in a plurality of edge periods and values in a plurality of data periods of data output from the summer circuit, and adjust a delay amount of the variable delay circuit such that timing of the second clock supplied from the variable delay circuit to the correction circuit becomes close to target timing according to a plurality of sampling results.

Exemplary embodiments of a semiconductor integrated circuit and a reception device will be explained below in detail with reference to the accompanying drawings. The present invention is not limited to the following embodiments.

Embodiment

Figure 1:
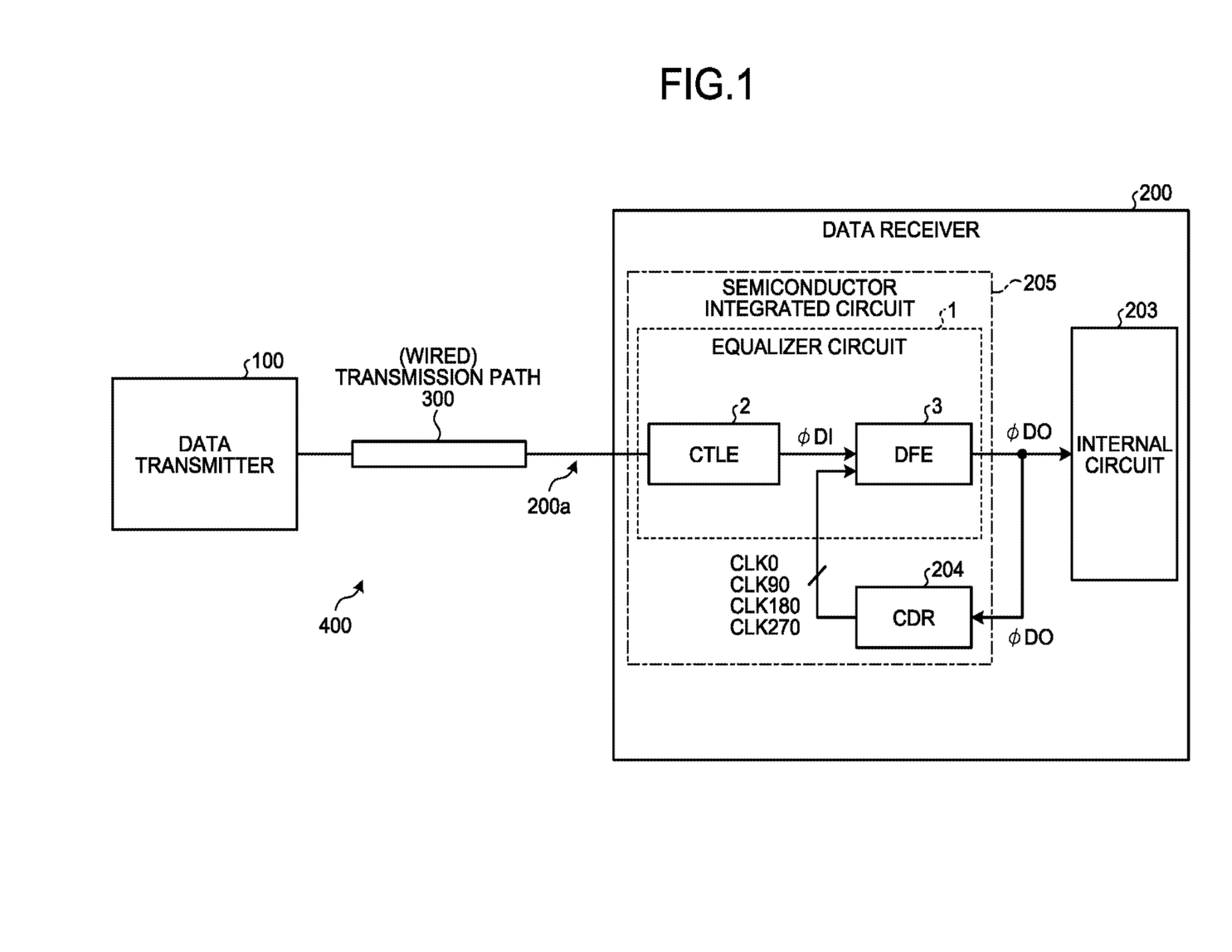
FIG. 1 is a block diagram illustrating a configuration of a communication system including a reception device that includes a semiconductor integrated circuit according to an embodiment.

A data receiver including a semiconductor integrated circuit according to an embodiment will be described with reference to FIG. 1. FIG. 1 is a block diagram illustrating a configuration of a communication system 400 including a data receiver 200 that includes a semiconductor integrated circuit 205 according to an embodiment.

The communication system 400 includes a data transmitter 100, a data receiver 200, and a wired communication path 300. The data transmitter 100 and the data receiver 200 are connected in a communicable manner through the wired communication path 300. The data transmitter 100 transmits data to the data receiver 200 through the wired communication path 300. Specifically, the data receiver 200 includes a reception node 200a to which the wired communication path 300 can be connected, and can receive the data from the data transmitter 100 through the wired communication path 300.

The data transmitter 100 is a transmission device to transmit a modulation signal that is transmission data, on which predetermined modulation (for example, binary modulation such as NRZ) is performed, to the data receiver 200 through the wired communication path 300. The data receiver 200 is a reception device including a semiconductor integrated circuit 205 and an internal circuit 203. The semiconductor integrated circuit 205 includes an equalizer circuit 1 and a clock data recovery (CDR) circuit 204. The equalizer circuit 1 is electrically connected to the reception node 200a.

The equalizer circuit 1 performs equalization processing with respect to a modulation signal φDI by using a multi-phase clock supplied from the CDR circuit 204, and recovers to output data φDO to a CDR circuit 204 and the internal circuit 203. The CDR circuit 204 generates a multi-phase clock from the data φDO. The CDR circuit 204 supplies the generated multi-phase clock to the equivalent circuit 1. With this arrangement, the equalizer circuit 1 equalizes the modulation signal φDI again by using the multi-phase clock supplied from the CDR circuit 204. That is, accuracy of equalization processing by the equalizer circuit 1 influences accuracy of generating of a multi-phase clock by the CDR circuit 204.

The multi-phase clock generated in the CDR circuit 204 includes a plurality of clocks CLK0, CLK90, CLK180, and CLK270 having different phases from each other, respectively. A phase difference between each of the clocks CLK0, CLK90, CLK180, and CLK270 in the multi-phase clock and a clock having the closest phase is the same phase (such as 90°). Phase differences of the clocks CLK0, CLK90, CLK180, and CLK270 from a phase of the clock CLK0 that is a reference are 0°, 90°, 1800, and 270° respectively.

Figure 2A:
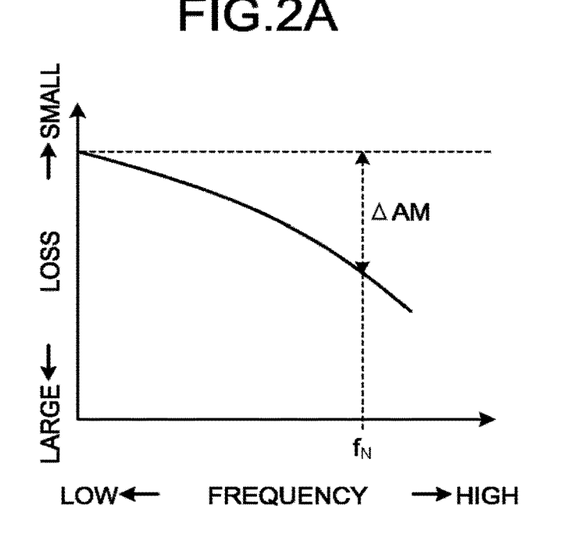
FIG. 2A to FIG. 2C are conceptual diagrams illustrating frequency characteristics of a wired communication path, a CTLE circuit, and a DFE circuit in the embodiment.

In wired communication, a data rate becomes higher increasingly and communication at a high frequency band may be performed. In the wired communication path 300, because of a channel loss due to a skin effect, a dielectric loss, or the like of a conducting wire, a radiofrequency component of a signal intensity loss in a transmission signal is likely to be large compared to a low-frequency component of that as illustrated in FIG. 2A. In a Nyquist frequency (frequency of half of data transmission rate in NRZ) $f_N$, a loss in signal intensity of the modulation signal φDI becomes ΔAM. Here, the signal intensity corresponds to a gain of configuration portions in a signal transmission path.

In order to compensate the attenuation, the equalizer circuit 1 illustrated in FIG. 1 includes a continuous time linear equalizer (CTLE) circuit 2 to perform equalization processing in a first stage. As indicated by a dashed-dotted line in FIG. 2B, a gain characteristic of the CTLE circuit 2 may be designed with an inverse characteristic of an attenuation characteristic of the wired communication path 300. However, actually, attenuation for ΔG is generated with respect to the characteristic of the dashed-dotted line in the Nyquist frequency $f_N$, as indicated by a solid line in FIG. 2B.

Thus, the equalizer circuit 1 illustrated in FIG. 1 includes a decision feedback equalizer (DFE) circuit 3 that performs equivalent processing in a second stage. As indicated by a solid line in FIG. 2C, the DFE circuit 3 may be designed to have a gain for ΔG in the vicinity of the Nyquist frequency $f_N$. The DFE circuit 3 compensates a deterioration in an input signal with a gain for ΔG, which corresponds to a deterioration in signal intensity due to an influence on the input signal from a past input signal, in such a manner as to compensate inter symbol interference.

Figure 2B:
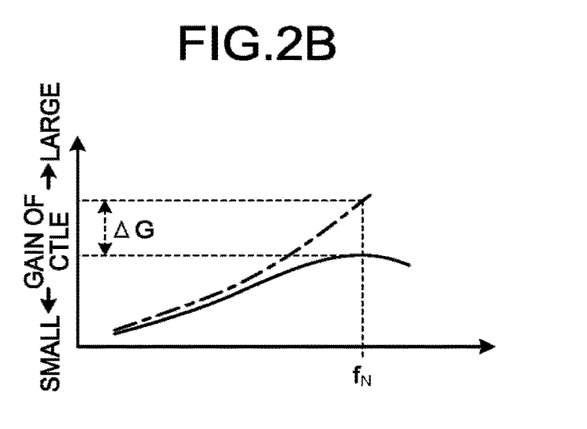
Figure 2C:
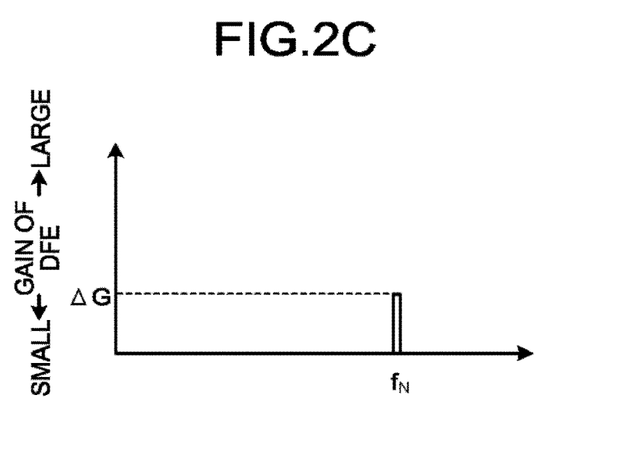

More specifically, with respect to each piece of data of up to N (N is integer equal to or larger than 1) cycles before, the DFE circuit 3 performs determination whether the data is 0 or 1, multiples each result thereof by a tap coefficient, and gives a feedback, whereby waveform equalization corresponding to the gain for ΔG is performed. A circuit that performs multiplication by a tap coefficient and gives a feedback is called a tap (TAP), and the number of taps N is called the number of taps. Note that FIG. 2A to FIG. 2C are diagrams illustrating frequency characteristics of the wired communication path, the CTLE circuit, and the DFE circuit, respectively.

Figure 3:
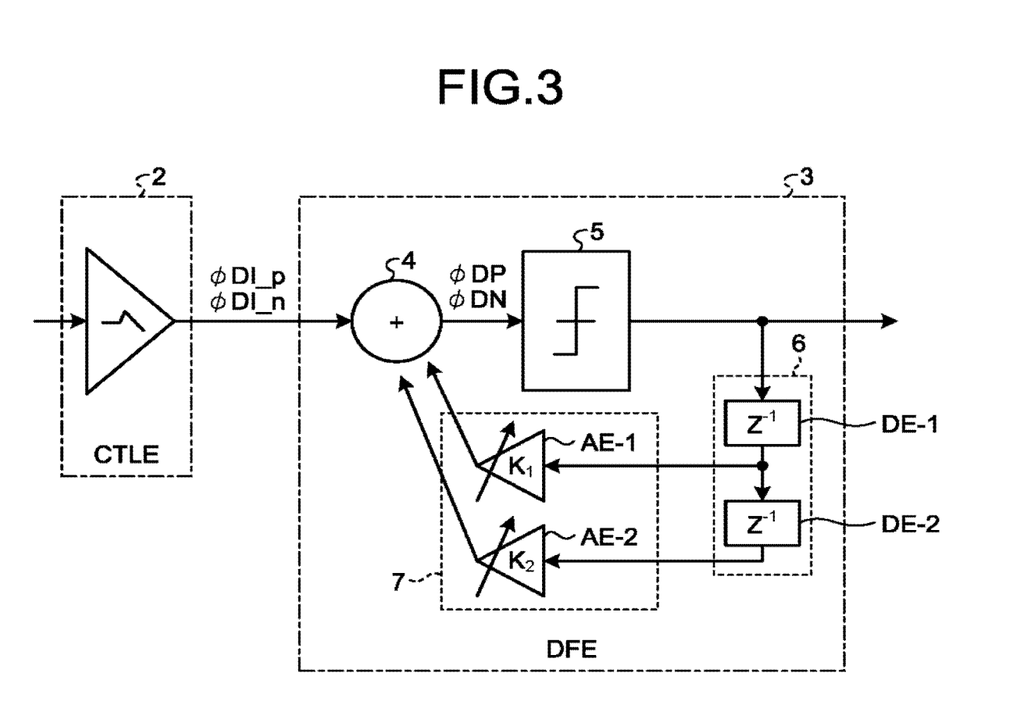
FIG. 3 is a circuit diagram illustrating a schematic configuration of the DFE circuit in the embodiment.

As illustrated in FIG. 3, the DFE circuit 3 includes a summer circuit 4, a determination circuit 5, a delay circuit 6, and a tap circuit 7. FIG. 3 is a circuit diagram illustrating a schematic configuration of the DFE circuit 3. The delay circuit 6 includes two delay elements DE-1 and DE-2. The tap circuit 7 includes two multiplication elements AE-1 and AE-2. Although a case where the number of taps is two is exemplified in FIG. 3, the number of taps may be equal to or larger than three.

The summer circuit 4 is provided between the CTLE circuit 2 and the determination circuit 5. Each of the delay elements DE-1 and DE-2, and each of the multiplication elements AE-1 and AE-2 are provided in a feedback path from an output node of the determination circuit 5 back to the summer circuit 4. Each of the delay elements DE-1 and DE-2 has a delay amount $Z^{-1}$ to be given. The multiplication elements AE-1 and AE-2 respectively have tap coefficients $K_1$ and $K_2$ for multiplication.

The summer circuit 4 can receive a pair of differential signals φDI_p and φDI_n as signals φDI from the CTLE circuit 2. The summer circuit 4 performs addition (such as current addition) of a signal fed back from each tap circuit 7 to each of the differential signals φDI_p and φDI_n, and supplies each of differential signals φDP and φDN that are results of the addition to the determination circuit 5.

For example, the determination circuit 5 determines whether each of the supplied differential signals φDP and φDN is a logical value of 0 or 1, and supplies a signal of a result of the determination to the tap circuit 7 through the delay circuit 6. The tap circuit 7 multiplies the signal supplied from the determination circuit 5 by the tap coefficients $K_1$ and $K_2$ and gives a feedback to the summer circuit 4.

Figure 4:
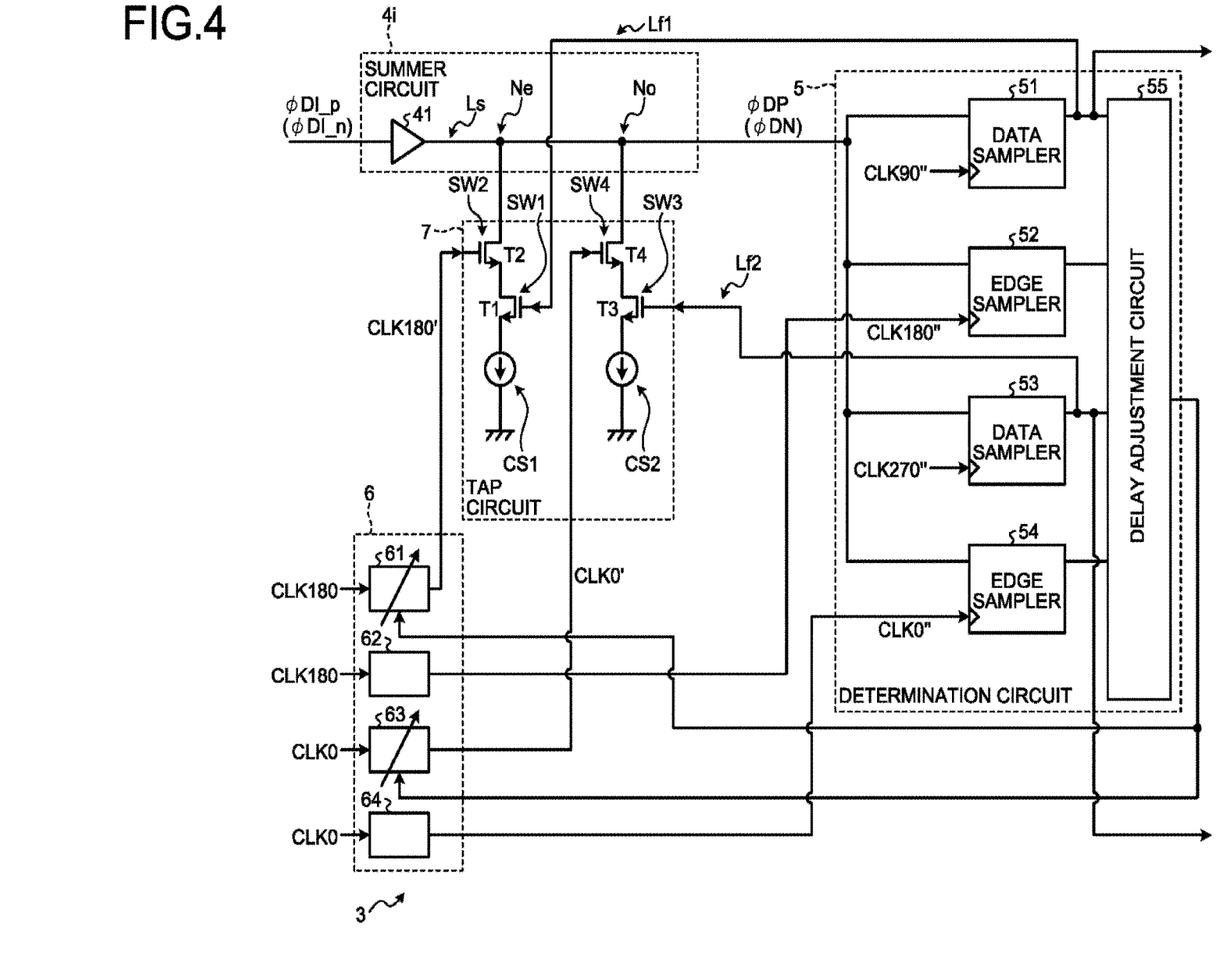
FIG. 4 is a circuit diagram illustrating one example of a configuration of the DFE circuit in the embodiment.

In a case where the number of taps is one, the DFE circuit 3 may be configured in a manner illustrated in FIG. 4. FIG. 4 is a circuit diagram illustrating one example of a configuration of the DFE circuit 3. The DFE circuit 3 may be configured to process a differential signal. In FIG. 4, a signal line and a circuit element on a P side of a difference are illustrated and described for simplification. However, a signal line and a circuit element on an N side of the difference may be configured in a similar manner.

In the DFE circuit 3 illustrated in FIG. 4, a determination circuit 5 is provided in an output node of a summer circuit 4, an output node of the determination circuit 5 and a control node of a tap circuit 7 are connected by a plurality of feedback lines Lf1 and Lf2, and an output node of the tap circuit 7 is connected to a current addition node of the summer circuit 4. Also, an output node of a delay circuit 6 is connected to a clock node of the determination circuit 5 and a clock node of the tap circuit 7.

Also, in order to increase operation speed, an interleaved configuration including a configuration of an Even system corresponding to an even-numbered edge in a basic clock (such as CLK0), and a configuration of an Odd system corresponding to an odd-numbered edge in the basic clock is employed as the DFE circuit 3.

The summer circuit 4 includes an amplifier 41, a signal line Ls, and current addition nodes Ne and No. In the summer circuit 4, the current addition node Ne is a configuration of the Even system. The current addition node No is a configuration of the Odd system.

The amplifier 41 receives and amplifies a signal φDI_p (and signal φDI_n), and outputs the amplified signal. An output node of the amplifier 41 is electrically connected to the signal line Ls. The current addition node Ne and the current addition node No are provided in the signal line Ls.

The delay circuit 6 includes a variable delay circuit 61, a delay circuit 62, a variable delay circuit 63, and a delay circuit 64. Each of a change delay circuit 61, the delay circuit 62, the variable delay circuit 63, and the delay circuit 64 is also called a clock buffer.

The variable delay circuit 61 is configured in such a manner that a delay amount can be changed. The variable delay circuit 61 receives a clock CLK180 from a CDR circuit 204, gives a changed delay amount to the clock CLK180, and generates a variable delay clock CLK180'. The variable delay circuit 61 supplies the variable delay clock CLK180' to a clock node for Even of the tap circuit 7.

The delay circuit 62 has a fixed delay amount. The delay circuit 62 receives the clock CLK180 from the CDR circuit 204, gives the fixed delay amount to the clock CLK180, and generates a fixed delay clock CLK180". The delay circuit 62 supplies the fixed delay clock CLK180" to a clock node of an edge sampler 52 for Even.

The variable delay circuit 63 is configured in such a manner that a delay amount can be changed. The variable delay circuit 63 receives a clock CLK0 from the CDR circuit 204, gives a changed delay amount to the clock CLK0, and generates a variable delay clock CLK0'. The variable delay circuit 63 supplies the variable delay clock CLK0' to a clock node for Odd of the tap circuit 7.

The delay circuit 64 has a fixed delay amount. The delay circuit 64 receives the clock CLK0 from the CDR circuit 204, gives the fixed delay amount to the clock CLK0, and generates a fixed delay clock CLK0". The delay circuit 64 supplies the fixed delay clock CLK0" to a clock node of an edge sampler 54 for Odd.

Note that although the delay circuit 6 further includes a delay circuit for CLK90 and a delay circuit for CLK270, illustration thereof is omitted in FIG. 4 for simplification of the drawing. The delay circuit for a clock CLK90 receives CLK90 from the CDR circuit 204, gives a fixed delay amount to the clock CLK90, and generates a fixed delay clock CLK90". The delay circuit for CLK90 supplies the fixed delay clock CLK90" to a clock node of a data sampler 51 for Even. The delay circuit for CLK270 receives a clock CLK270 from the CDR circuit 204, gives a fixed delay amount to the clock CLK270, and generates a fixed delay clock CLK270". The delay circuit for CLK270 supplies the fixed delay clock CLK270" to a clock node of a data sampler 53 for Odd.

The determination circuit 5 includes the data sampler 51, the edge sampler 52, the data sampler 53, and the edge sampler 54.

The data sampler 51, for example, includes a flip-flop. A data input node is electrically connected to the signal line Ls, a clock node is electrically connected to an output node of the delay circuit for a clock CLK90, and an output node is electrically connected to the feedback line Lf1, an internal circuit 203 (see FIG. 1), and an input node of the CDR circuit 204.

The edge sampler 52, for example, includes a flip-flop. A data input node is electrically connected to the signal line Ls, and a clock node is electrically connected to an output node of the delay circuit 6 (delay circuit 62).

The data sampler 53, for example, includes a flip-flop. A data input node is electrically connected to the signal line Ls, a clock node is electrically connected to an output node of the delay circuit for CLK270, and an output node is electrically connected to the feedback line Lf2, the internal circuit 203, and an input node of the CDR circuit 204.

The edge sampler 54, for example, includes a flip-flop. A data input node is electrically connected to the signal line Ls, and a clock node is electrically connected to an output node of the delay circuit 6 (delay circuit 64).

In the determination circuit 5, the data sampler 51 and the edge sampler 52 are configurations of the Even system. The data sampler 51 performs sampling of a data part of a data signal φDP in synchronization with the clock CLK90" for Even. The edge sampler 52 performs sampling of an edge part of the data signal φDP in synchronization with the fixed delay clock CLK180" for Even.

In the determination circuit 5, the data sampler 53 and the edge sampler 54 are configurations of the Odd system. The data sampler 53 performs sampling of a data part of the data signal φDP in synchronization with the clock CLK270" for Odd. The edge sampler 54 performs sampling of an edge part of the data signal φDP in synchronization with the fixed delay clock CLK0" for Odd.

In the plurality of feedback lines Lf1 and Lf2, the feedback line Lf1 is a configuration of the Even system, and connects an output node of the data sampler 51 for Even to a part of a control node of the tap circuit 7. The feedback line Lf2 is a configuration of the Odd system, and connects an output node of the data sampler 53 for Odd to a different part of the control node of the tap circuit 7.

The tap circuit 7 includes a current supply CS1, a switch SW1, a switch SW2, a current supply CS2, a switch SW3, and a switch SW4.

In the tap circuit 7, the current supply CS1, the switch SW1, and the switch SW2 are configurations of the Even system. The feedback line Lf1 for Even is connected to a control node of the switch SW1. A control node of the switch SW2 configures a clock node for Even and receives a variable delay clock CLK180' for Even from the variable delay circuit 61.

In the tap circuit 7, the current supply CS2, the switch SW3, and the switch SW4 are configurations of the Odd system. The feedback line Lf2 for Odd is connected to a control node of the switch SW3. A control node of the switch SW4 configures a clock node for Odd and receives a variable delay clock CLK0' for Odd from the variable delay circuit 61.

The switch SW2 is provided between the current addition node Ne and the switch SW1, and the switch SW1 is provided between the switch SW2 and the current supply CS1. When both of the switch SW2 and the switch SW1 are turned on, the signal line Ls and the current supply CS1 may be electrically connected. The switch SW1 may include an NMOS transistor T1. The switch SW2 may include an NMOS transistor T2. In the NMOS transistor T1, a gate is electrically connected to the feedback line Lf1, a source is electrically connected to the current supply CS1, and a drain is electrically connected to the NMOS transistor T1. In the NMOS transistor T2, a gate is electrically connected to an output node of the variable delay circuit 61, a source is electrically connected to the NMOS transistor T1, and a drain is electrically connected to the current addition node Ne. The gate of the NMOS transistor T1 configures a control node for Even, and the gate of the NMOS transistor T2 configures a clock node for Even.

For example, the signal line Ls and the current supply CS1 are electrically connected in response to switching of the variable delay clock CLK180' from a non-active level to an active level in a state in which a signal from the feedback line Lf1 is an active level (such as H level) (for example, at timing at which variable delay clock CLK180' rise from L level to H level). In response, a feedback signal for Even is supplied from the tap circuit 7 (that is, current supply CS1, switch SW1, and switch SW2) to the current addition node Ne. That is, rising timing of the variable delay clock CLK180' prescribes feedback timing of the Even system.

The switch SW4 is provided between the current addition node No and the switch SW3, and the switch SW3 is provided between the switch SW4 and the current supply CS2. When both of the switch SW4 and the switch SW3 are turned on, the signal line Ls and the current supply CS2 may be electrically connected. The switch SW3 may include an NMOS transistor T3. The switch SW4 may include an NMOS transistor T4. In the NMOS transistor T3, a gate is electrically connected to the feedback line Lf2, a source is electrically connected to the current supply CS2, a drain is electrically connected to the NMOS transistor T4. In the NMOS transistor T4, a gate is electrically connected to the output node of the variable delay circuit 61 through an inverter INV1, a source is electrically connected to the NMOS transistor T3, and a drain is electrically connected to the current addition node No. A gate of the NMOS transistor T3 configures a control node for Odd, and a gate of the NMOS transistor T4 configures a clock node for Odd.

For example, the signal line Ls and the current supply CS2 are electrically connected in response to switching of the variable delay clock CLK0' from a non-active level to an active level in a state in which a signal from the feedback line Lf2 is an active level (such as H level) (for example, at timing at which variable delay clock CLK0' rise from L level to H level). In response, a feedback signal is supplied from the tap circuit 7 (that is, current supply CS2, switch SW3, and switch SW4) to the current addition node Ne. That is, rising timing of the variable delay clock CLK0' prescribes feedback timing of the Odd system.

Figure 5:
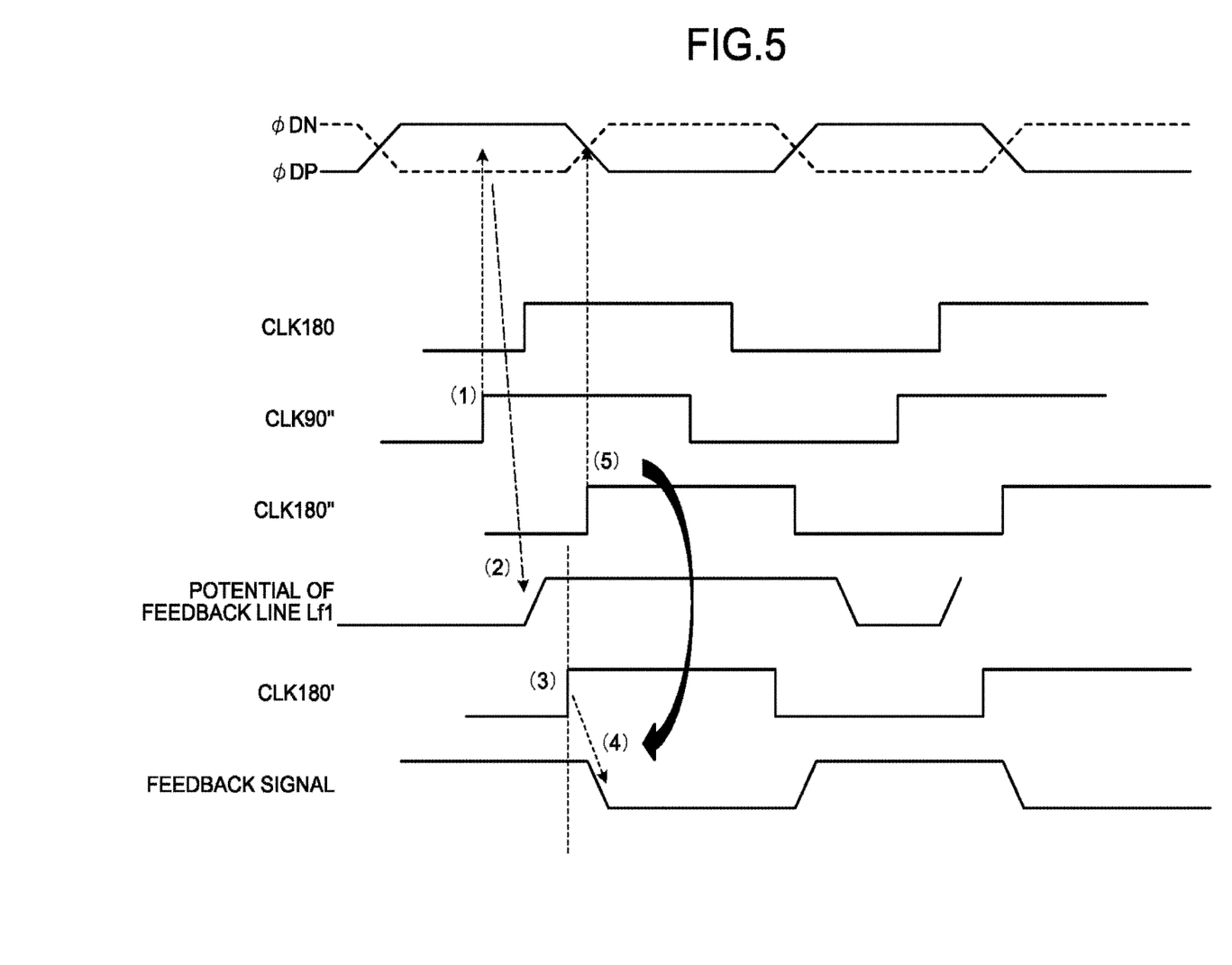
FIG. 5 is a waveform diagram illustrating feedback timing in the embodiment.

In a case where feedback timing of the Even system is adjusted, it is considered to perform an operation illustrated in FIG. 5. FIG. 5 is a waveform diagram illustrating feedback timing. Although feedback timing of the Even system is exemplified in FIG. 5, feedback timing of the Odd system is in a similar manner.

At timing (1), sampling of a data part of a signal φDP is performed by the data sampler 51 in synchronization with a rise of the fixed delay clock CLK90". An output of the data sampler 51 transitions from an L level to an H level. In response, the feedback line Lf1 is charged, and potential of the feedback line Lf1 transitions from an L level to an H level at timing (2). At timing (3), when the variable delay clock CLK180' rises from an L level to an H level, a feedback signal from the tap circuit 7 is supplied to the current addition node Ne at timing (4). In response, the signal φDP to which the feedback signal is added falls from an H level to an L level. On the one hand, sampling of an edge part of the signal φDP is performed by the edge sampler 52 in synchronization with a rise of the fixed delay clock CLK180" at timing (5). For example, it is considered to perform control (adjustment) of synchronizing the timing (4) and the timing (5) before shipping by performing calibration using a waveform of a test signal in a state in which the test signal is input.

The timing (4) in FIG. 5 indicates feedback timing to the signal φDP. It is preferable that the feedback timing (4) accurately match edge timing of the signal φDP (that is, transition timing of signal level).

Accuracy of this feedback timing (such as timing (4) illustrated in FIG. 5) influences accuracy of waveform equalization of a signal φDP compensated by a feedback. When the feedback timing is deviated from appropriate timing (such as edge timing of signal φDP illustrated in FIG. 5), data φDO sampled by the determination circuit 5 with an edge part of a waveform of a signal φDP being kept deformed is supplied to the CDR circuit 204. Thus, there is a possibility that a deformed edge part in the data φDO is sampled and a deviation in a lock point locked at timing deviated from appropriate edge timing is generated in the CDR circuit 204. Then, when the DFE circuit 3 receives multi-phase clocks CLK0, CLK90, CLK180, and CLK270 with deteriorated accuracy from the CDR circuit 204 due to the deviation in a lock point and performs equalization, there is a possibility that accuracy of the equalization is further deteriorated.

Also, this feedback timing may vary depending on operating environment such as supply voltage supplied from the outside (such as power circuit) to the equalizer circuit 1 and/or temperature around the equalizer circuit 1. Thus, the equalizer circuit 1 preferably adjusts this feedback timing in a background operation during an operation of the data receiver 200.

Thus, in the present embodiment, a deviation of feedback timing from edge timing is determined according to a pattern of sampling results of a data part and an edge part of a data signal and a delay amount of the variable delay circuit 61 is adjusted according to a result of the determination in the DFE circuit 3. Thus, the feedback timing during an operation of the data receiver 200 is made appropriate.

More specifically, first edge timing that is not influenced by a feedback signal (that is, timing at which there is no transition in level of immediately-preceding data signal to be base of feedback and there is no feedback substantially) and second edge timing influenced by a feedback signal (that is, timing at which there is transition in level of immediately-preceding data signal to be base of feedback and there is feedback substantially) in the DFE circuit 3 are compared. When feedback timing is fast, a period from the first edge timing to the second edge timing appears to be shorter than 1 UI. 1 UI is a period corresponding to a half of a cycle of each of the clocks CLK0, CLK90, CLK180, and CLK270 included in the multi-phase clock. When feedback timing slow, a period from the first edge timing to the second edge timing appears to be longer than 1 UI. Patterns of sampling results of a data part and an edge part of a data signal are different between a case where the period from the first edge timing to the second edge timing is longer than 1 UI and a case where the period is shorter than 1 UI. Thus, it is possible to determine whether the feedback timing is deviated from appropriate timing (edge timing) in a slower direction or a faster direction by evaluating a pattern of the sampling results of the data part and the edge part of the data signal. Also, this pattern of the sampling results is assumed to be a pattern with which phase determination of a clock (determination of advanced phase/delayed phase of clock) performed in generating of the clock in the CDR circuit 204 is not performed. Moreover, since a determination operation using a data signal is performed, this determination operation can be performed as a background operation during an operation of the data receiver 200, that is, while the operation of the data receiver 200 is continued. With this arrangement, it is possible to perform determination of a deviation (determination of being fast/slow) of operation feedback timing of the data receiver 200 from appropriate timing (edge timing) without interfering with phase determination of a clock in the CDR circuit 204.

More specifically, in the DFE circuit 3, the determination circuit 5 further includes a delay adjustment circuit 55, as illustrated in FIG. 4. An input node of the delay adjustment circuit 55 is electrically connected to an output node of the data sampler 51, an output node of the edge sampler 52, an output node of the data sampler 53, and an output node of the edge sampler 54. An output node of the delay adjustment circuit 55 is electrically connected to a control node of the variable delay circuit 61.

For example, when an adjustment of feedback timing of the Even system is exemplified, the delay adjustment circuit 55 receives a sampling result of a data part of a data signal from the data sampler 51, and receives a sampling result of an edge part of the data signal from the edge sampler 52. The delay adjustment circuit 55 adjusts a delay amount of the variable delay circuit 61 according to the sampling result by the edge sampler 52 and the sampling result by the data sampler 51. The delay adjustment circuit 55 adjusts the delay amount of the variable delay circuit 61 in a case where a combination of the sampling result by the edge sampler 52 and the sampling result by the data sampler 51 matches a predetermined pattern. The delay adjustment circuit 55 adjusts the delay amount of the variable delay circuit 61 in a case where a combination of the sampling result by the edge sampler 52 and the sampling result by the data sampler 51 matches at a predetermined repetition (such as a case where the number of times of matching reaches the threshold number of times (such as five times)). The delay adjustment circuit 55 may adjust the delay amount of the variable delay circuit 61 by generating a delay control signal indicating whether to increase the delay amount and by supplying the signal to the control node of the variable delay circuit 61.

In a case where it is indicated by the delay control signal to increase the delay amount, the variable delay circuit 61 increases the delay amount. With this arrangement, rising timing of the variable delay clock CLK180' supplied from the variable delay circuit 61 to the tap circuit 7 becomes slow and the feedback timing may be changed to slower timing. Also, in a case where it is indicated by the delay control signal to decrease the delay amount, the variable delay circuit 61 decreases the delay amount. With this arrangement, rising timing of the variable delay clock CLK180' supplied from the variable delay circuit 61 to the tap circuit 7 becomes fast and the feedback timing may be changed to faster timing. Note that a delay amount may be increased/decreased according to a delay control signal and rising timing of the variable delay clock CLK0' may be changed similarly in the variable delay circuit 63. However, the variable delay circuit 61 and the variable delay circuit 63 may receive a delay control signal that is identical to the delay control signal to the variable delay circuit 61 or may receive a different delay control signal from a delay control circuit 55.

Figure 6A:
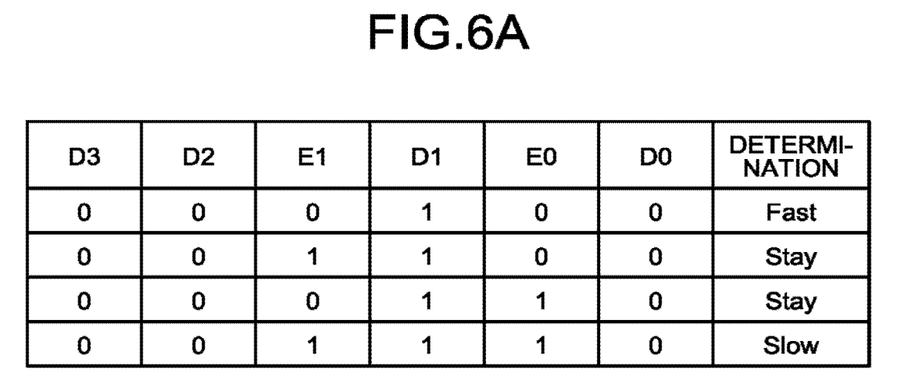
FIG. 6A and FIG. 6B are diagrams illustrating patterns of a sampling result in the embodiment.

Also, the delay adjustment circuit 55 may adjust the delay amount of the variable delay circuit 61 in such a manner that the feedback timing becomes close to target timing (that is, edge timing) according to a sampling result by the edge samplers 52 and 54 and a sampling result by the data samplers 51 and 53. For example, when k is an arbitrary integer equal to or larger than 0, it is assumed that the sampling result by the data samplers 51 and 53 is expressed by Dk and the sampling result by the edge samplers 52 and 54 is expressed by Ek. That is, determination of the feedback timing is performed by utilization of a sampling result that is a combination of both of a sampling result by a sampler of the Even system (data sampler 51 and edge sampler 52) and a sampling result by a sampler of the Odd system (data sampler 53 and edge sampler 54). According to a sampling result (D3, D2, E1, D1, E0, D0)=(0, 0, 0, 1, 0, 0) illustrated in FIG. 6A, the delay adjustment circuit 55 determines that feedback timing is faster than appropriate timing (it is assumed that feedback timing being early is called "Fast" for distinction from advanced phase (Early) in phase determination). FIG. 6A is a pattern of a sampling result for determination of the feedback timing. The delay adjustment circuit 55 generates a delay control signal indicating to increase a delay amount and supplies the signal to the control node of the variable delay circuit 61 according to a determination result indicating that the feedback timing is fast.

Alternatively, according to a sampling result (D3, D2, E1, D1, E0, D0)=(0, 0, 1, 1, 1, 0), the delay adjustment circuit 55 determines that feedback timing is slower than appropriate timing (it is assumed that feedback timing being late is called "Slow" for distinction from delayed phase (Late) in phase determination). The delay adjustment circuit 55 generates a delay control signal indicating to reduce a delay amount and supplies the signal to the control node of the variable delay circuit 61 according to a result of the determination that the feedback timing is slow (Slow).

Alternatively, the delay adjustment circuit 55 determines that feedback timing is appropriate timing (Stay) according to a sampling result (D3, D2, E1, D1, E0, D0)=(0, 0, 1, 1, 0, 0) or (0, 0, 0, 1, 1, 0). The delay adjustment circuit 55 generates a delay control signal indicating to keep a delay amount and supplies the signal to the control node of the variable delay circuit 61 according to a result of the determination that the feedback timing is appropriate timing (Stay).

Figure 6B:
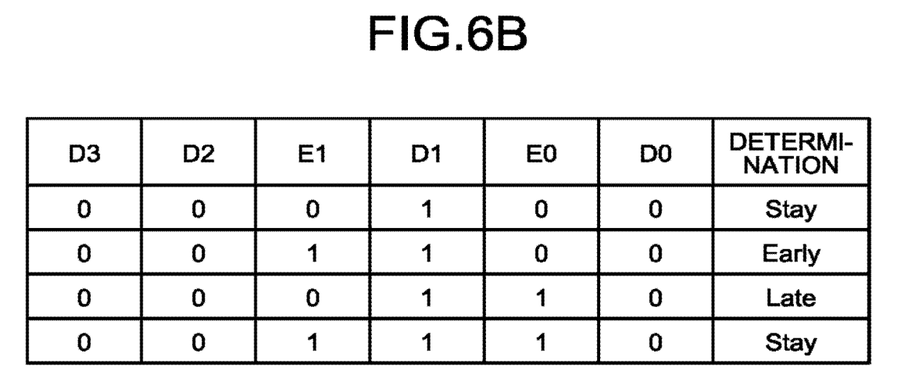

Note that an operation of phase determination in the CDR circuit 204 is illustrated in FIG. 6B for reference. The data samplers 51 and 53 and the edge samplers 52 and 54 illustrated in FIG. 4 are shared and used by the DEF circuit 3 and the CDR circuit 204. The CDR circuit 204 performs sampling of each of a data part and an edge part in a data signal by using the data samplers 51 and 53 and the edge samplers 52 and 54. As illustrated in FIG. 6B, the CDR circuit 204 determines whether a phase of a clock is advanced (Early) or delayed (Late) from a phase to be locked according to a pattern of a sampling result (D3, D2, E1, D1, E0, D0). The CDR circuit 204 performs a phase adjustment to delay the phase of the clock according to determination as an advanced phase (Early), and performs a phase adjustment to advance the phase of the clock according to determination as a delayed phase (Late).

As it is understood from comparison between FIG. 6A and FIG. 6B, a pattern of a sampling result with which pattern the delay adjustment circuit 55 of the DFE circuit 3 determines feedback timing is fast (Fast) or slow (Slow) is a pattern with which a phase adjustment in the CDR circuit 204 is not performed (Stay). On the other hand, a pattern of a sampling result with which pattern it is determined that a phase is advanced (Early) or a phase is delayed (Late) in the CDR circuit 204 is a pattern with which the delay adjustment circuit 55 of the pattern DFE circuit 3 determines to keep feedback timing (Stay). With this arrangement, the DFE circuit 3 can perform an adjustment of feedback timing in such a manner as not to interfere with a phase adjustment in the CDR circuit 204.

Figure 7A:
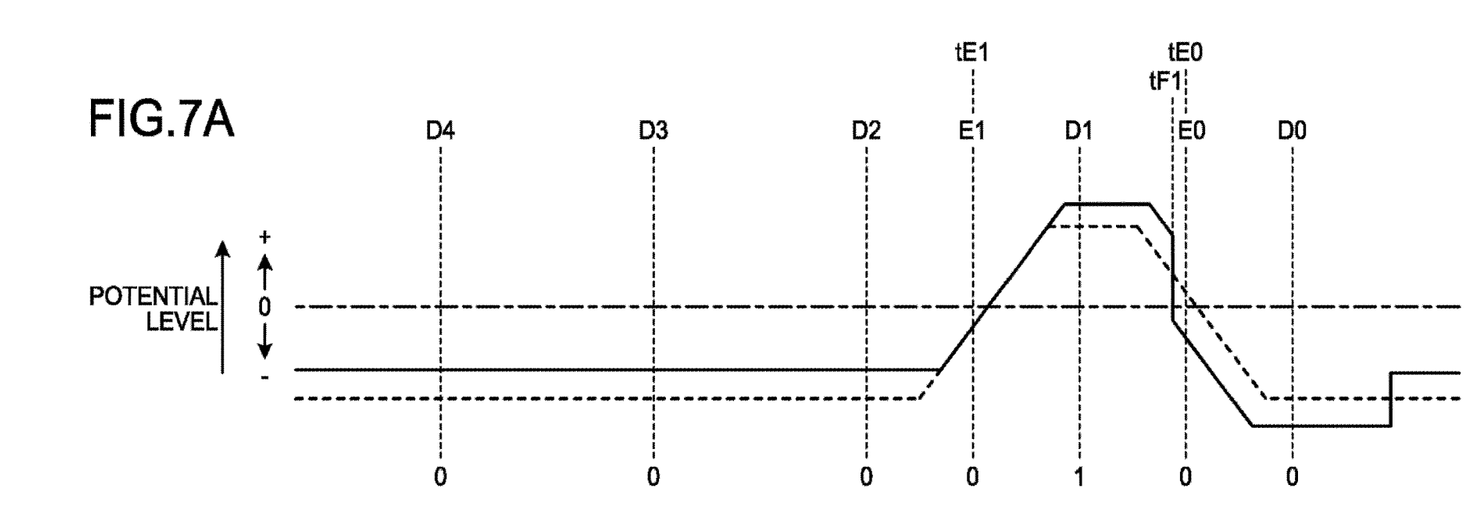
FIG. 7A and FIG. 7B are waveform diagrams illustrating operations of the DFE circuit in the embodiment.
Figure 7B:
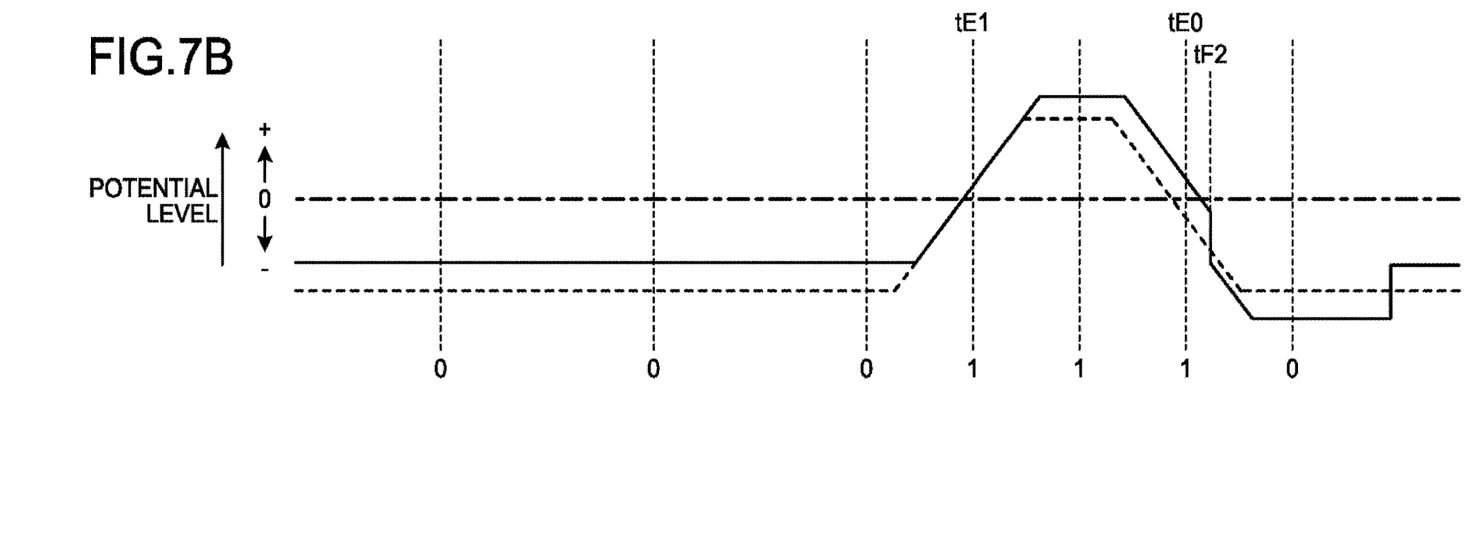

Here, a waveform of a case where feedback timing tF1 is faster than appropriate timing (target timing) tE0 is indicated by a solid line in FIG. 7A. FIG. 7A and FIG. 7B are waveform diagrams illustrating operations of the DFE circuit 3, and a potential level (0V) to be a reference of a differential signal is indicated by a dashed-dotted line. That is, an edge by a feedback is formed at timing tF1 faster than appropriate edge timing tE0 in the waveform indicated by the solid line in FIG. 7A compared to an original waveform that corresponds to a waveform before equalization by DFE 3 and that is indicated by a dotted line in FIG. 7A. In FIG. 7A, E1 corresponds to first edge timing tE1 (that is, timing at which there is no transition in level of immediately-preceding data signal to be base of feedback and there is no feedback substantially), E0 corresponds to second edge timing tE0 (that is, timing at which there is transition in level of immediately-preceding data signal to be base of feedback and there is feedback substantially), and a period from tE1 to tE0 corresponds to 1 UI.

Here, the edge sampler 51 and the data sampler 52 respectively supply sampling results Ek and Dk (k is integer equal to or larger than 0) in a manner illustrated in FIG. 7A to the delay adjustment circuit 55. The delay adjustment circuit 55 determines that the feedback timing is faster than appropriate timing (Fast) according to a sampling result (D3, D2, E1, D1, E0, D0)=(0, 0, 0, 1, 0, 0). The delay adjustment circuit 55 generates a delay control signal indicating to increase a delay amount and supplies the signal to the control nodes of the variable delay circuits 61 and 63 according to a result of the determination that the feedback timing is fast (Fast). In response to the delay control signal indicating to increase the delay amount, the variable delay circuits 61 and 63 increase the delay amount. With this arrangement, rising timing of the variable delay clocks CLK180' and CLK0' supplied from the variable delay circuits 61 and 63 to the tap circuit 7 becomes slow and the feedback timing may be changed to slower timing.

Also, a waveform of a case where the feedback timing tF2 is slower than the appropriate timing (target timing) tE0 is indicated by a solid line in FIG. 7B. That is, an edge by a feedback is formed at the timing tF2 slower than the appropriate edge timing tE0 in the waveform indicated by the solid line in FIG. 7B compared to an original waveform that corresponds to a waveform before equalization by DFE 3 and that is indicated by a dotted line in FIG. 7B. In FIG. 7B, E1 corresponds to the first edge timing tE1 (that is, timing at which there is no transition in level of immediately-preceding data signal to be base of feedback and there is no feedback substantially), E0 corresponds to the second edge timing tE0 (that is, timing at which there is transition in level of immediately-preceding data signal to be base of feedback and there is feedback substantially), and a period from tE1 to tE0 corresponds to 1 UI.

Here, the edge sampler 51 and the data sampler 52 respectively supply sampling results Ek and Dk (k is integer equal to or larger than 0) in a manner illustrated in FIG. 7B to the delay adjustment circuit 55. The delay adjustment circuit 55 determines that the feedback timing is slower than appropriate timing (Slow) according to a sampling result (D3, D2, E1, D1, E0, D0)=(0, 0, 1, 1, 1, 0). The delay adjustment circuit 55 generates a delay control signal indicating to reduce a delay amount and supplies the signal to the control nodes of the variable delay circuits 61 and 63 according to a result of the determination that the feedback timing is slow (Slow). In response to the delay control signal indicating to decrease the delay amount, the variable delay circuits 61 and 63 decrease the delay amount. With this arrangement, rising timing of the variable delay clocks CLK180' and CLK0' supplied from the variable delay circuits 61 and 63 to the tap circuit 7 becomes faster and the feedback timing may be changed to faster timing.

As described above, in the present embodiment, a deviation in feedback timing is determined according to a pattern of sampling results of a data part and an edge part of a data signal and a delay amount of the variable delay circuit 61 is adjusted according to a result of the determination in the DFE circuit 3. With this arrangement, it is possible to make the feedback timing appropriate during an operation of the data receiver 200. As a result, accuracy of this feedback timing (such as timing (4) illustrated in FIG. 5) is improved. Thus, it is possible to improve accuracy in waveform equalization in the DFE circuit 3 and to avoid a deviation in a lock point in the CDR circuit 204.

Also, in the present embodiment, it is possible to make the feedback timing appropriate according to a pattern of a sampling result of a data part and an edge part of a data signal. Thus, it is possible to make the feedback timing appropriate in a background operation during an operation by the data receiver 200. With this arrangement, in a case where a characteristic of a feedback operation in the DFE circuit 3 varies depending on operation environment such as voltage and/or temperature, it is possible to make the feedback timing appropriate dynamically.

Note that in the embodiment, a case where an interleaved configuration including a configuration of an Even system and a configuration of an Odd system is employed as a DEF circuit 3 is exemplified. However, an idea of the embodiment can be similarly applied to a case where a single configuration in which a configuration of an Odd system is omitted is employed as a DEF circuit 3.

Figure 8:
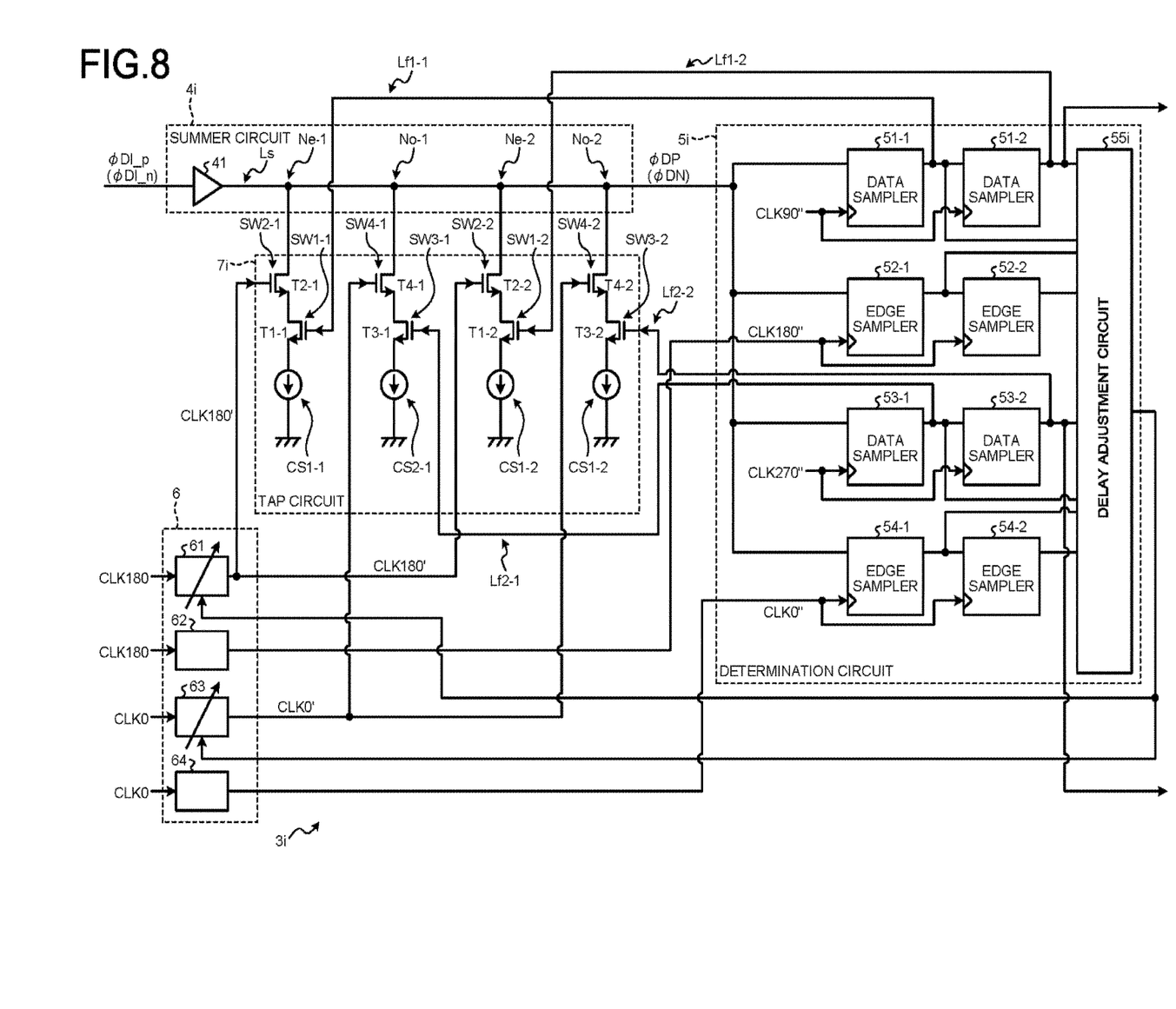
FIG. 8 is a circuit diagram illustrating one example of a configuration of a DFE circuit in a modification example of the embodiment.

A DFE circuit 3i may include a configuration of a plurality of taps. For example, in a case where the number of taps is two, the DFE circuit 3i may be configured in a manner illustrated in FIG. 8. FIG. 8 is a circuit diagram illustrating one example of a configuration of the DFE circuit 3i in a modification example of the embodiment. The DFE circuit 3i may be configured to process a differential signal. In FIG. 8, a signal line and a circuit element on a P side of a difference are illustrated and described for simplification. However, a signal line and a circuit element on an N side of the difference may be configured similarly.

In the DFE circuit 3i illustrated in FIG. 8, a configuration of the DFE circuit 3 illustrated in FIG. 4 is extended (duplicated) for a tap 1 and a tap 2. That is, current addition nodes Ne-1 and No-1 for the tap 1 and current addition nodes Ne-2 and No-2 for the tap 2 are provided in series in a signal line Ls.

In a determination circuit 5i, a data sampler 51-1 for the tap 1 and a data sampler 51-2 for the tap 2 are electrically connected in series, an edge sampler 52-1 for the tap 1 and an edge sampler 52-2 for the tap 2 are electrically connected in series, a data sampler 53-1 for the tap 1 and a data sampler 53-2 for the tap 2 are electrically connected in series, and an edge sampler 54-1 for the tap 1 and an edge sampler 54-2 for the tap 2 are electrically connected in series between the signal line Ls and a delay adjustment circuit 55i.

In a tap circuit 7i, a configuration of an Even system for the tap 1 (current supply CS1-1, switch SW1-1, and switch SW2-1), a configuration of an Odd system for the tap 1 (current supply CS2-1, switch SW3-1, and switch SW4-1), a configuration of an Even system for the tap 2 (current supply CS1-2, switch SW1-2, and switch SW2-2), and a configuration of an Odd system for the tap 2 (current supply CS2-2, switch SW3-2, and switch SW4-2) are respectively connected to the current addition nodes Ne-1, No-1, Ne-2, and No-2.

Figure 9A:
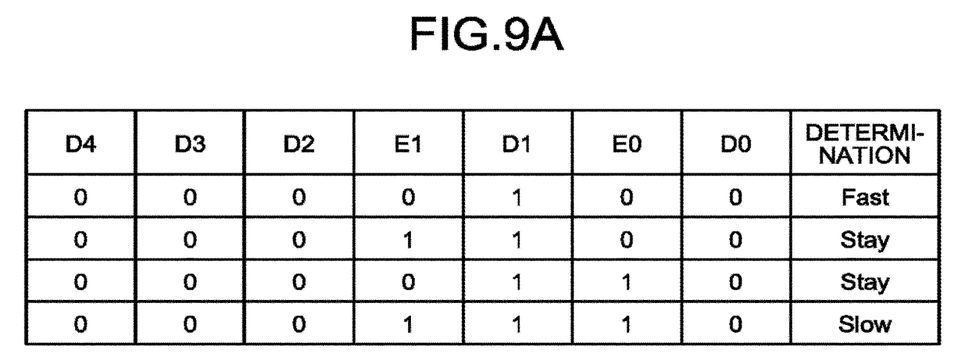
FIG. 9A and FIG. 9B are diagrams illustrating patterns of a sampling result in the modification example of the embodiment.
Figure 9B:
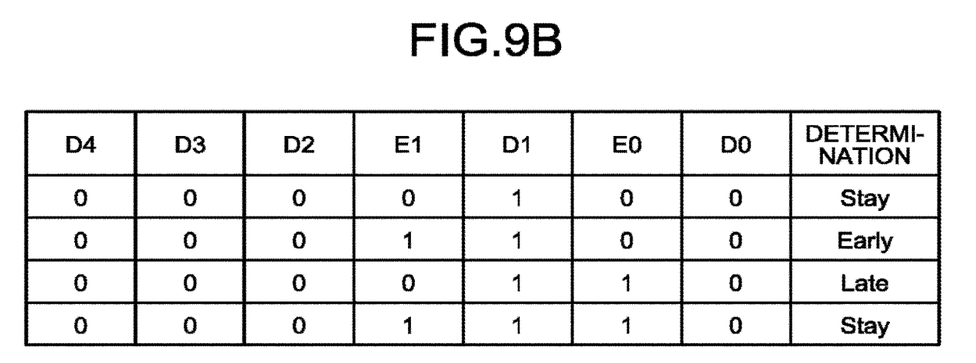

Also, an adjustment of feedback timing can be realized as extension of a case where the number of taps is one, as illustrated in FIG. 9A and FIG. 9B. FIG. 9A is a pattern of a sampling result to perform determination of feedback timing in a modification example of the embodiment. FIG. 9B is a pattern of a sampling result to perform an operation of phase determination in a CDR circuit 204 in the modification example of the embodiment. For example, as illustrated in FIG. 9A, a delay adjustment circuit 55 can determine whether feedback timing is fast (Fast) or slow (Slow) compared to appropriate timing according to a pattern of a sampling result in which a sampling result D4 of a data part is added to the sampling result illustrated in FIG. 6A. As illustrated in FIG. 9B, the CDR circuit 204 determines whether a phase of a clock is advanced (Early) or delayed (Late) from a phase to be locked according to a pattern of a sampling result in which the sampling result D4 of the data part is added to the sampling result illustrated in FIG. 6B.

Also, a point that a configuration is made in such a manner that a determination operation by the delay adjustment circuit 55 according to the sampling result illustrated in FIG. 9A and a determination operation by the CDR circuit 204 according to the sampling result illustrated in FIG. 9B do not interfere with each other is similar to that of the embodiment. With this arrangement, the DFE circuit 3i can adjust feedback timing in such a manner as not to interfere with a phase adjustment in the CDR circuit 204.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
a clock generation circuit configured to generate a first clock, and
an equalizer circuit,
wherein the equalizer circuit comprises:
a summer circuit,
a correction circuit that is electrically connected to the summer circuit and configured to be supplied a second clock on the basis of the first clock,
a variable delay circuit that is electrically connected to the correction circuit and configured to change a delay amount of the second clock, and
an adjustment circuit that is electrically connected to the summer circuit, and configured to perform sampling of values in a plurality of edge periods and values in a plurality of data periods of data output from the summer circuit, and adjust a delay amount of the variable delay circuit such that timing of the second clock supplied from the variable delay circuit to the correction circuit becomes close to target timing according to a plurality of sampling results, and
wherein the adjustment circuit comprises:
an edge sampler configured to perform sampling of the values in the edge periods of the data output from the summer circuit,
a data sampler configured to perform sampling of the values in the data periods of the data output from the summer circuit, and
a delay adjustment circuit configured to adjust the delay amount of the variable delay circuit according to a sampling result by the edge sampler and a sampling result by the data sampler.

2. The semiconductor integrated circuit according to claim 1,
wherein the adjustment circuit is configured to determine whether the timing of the second clock is deviated in a slower direction or a faster direction from the target timing according to the sampling results, and adjust the delay amount of the variable delay circuit according to a result of the determination.

3. The semiconductor integrated circuit according to claim 2,
wherein the adjustment circuit is configured to decrease the delay amount of the variable delay circuit in a case where the timing of the second clock is deviated in the slower direction from the target timing, and increase the delay amount of the variable delay circuit in a case where the timing of the second clock is deviated in the faster direction from the target timing.

4. The semiconductor integrated circuit according to claim 1,
wherein the target timing is transition timing of a signal level of the data output from the summer circuit.

5. The semiconductor integrated circuit according to claim 1,
wherein the delay adjustment circuit is configured to adjust the delay amount of the variable delay circuit in a case where a combination of the sampling result by the edge sampler and the sampling result by the data sampler match a predetermined pattern.

6. The semiconductor integrated circuit according to claim 5,
wherein when k is an integer equal to or larger than 0, the predetermined pattern includes a (k+3)-th data sampling result, a (k+2)-th data sampling result, a (k+1)-th edge sampling result, a (k+1)-th data sampling result, a k-th edge sampling result, and a k-th data sampling result, wherein the k-th edge sampling is a timing between the (k+1)-th data sampling and the k-th data sampling, and the (k+1)-th edge sampling is a timing between the (k+2)-th data sampling and the (k+1)-th data sampling.

7. The semiconductor integrated circuit according to claim 5,
wherein the delay adjustment circuit is configured to adjust the delay amount of the variable delay circuit in a case where the combination matches the predetermined pattern at a particular frequency.

8. The semiconductor integrated circuit according to claim 5, wherein the clock generation circuit is configured to generate the first clock by performing a phase adjustment with data output from the equalizer circuit and supply the first clock to the equalizer circuit,
wherein the predetermined pattern is a pattern with which the phase adjustment of the first clock is not performed in the clock generation circuit.

9. The semiconductor integrated circuit according to claim 1,
wherein in a case where a combination of the sampling result by the edge sampler and the sampling result by the data sampler matches a predetermined pattern, the delay adjustment circuit is configured to determine whether the timing of the second clock is deviated in a slower direction or a faster direction from the target timing and adjust the delay amount of the variable delay circuit according to a result of the determination.

10. The semiconductor integrated circuit according to claim 9,
wherein the delay adjustment circuit is configured to decrease the delay amount of the variable delay circuit in a case where the timing of the second clock is deviated in the slower direction from the target timing, and increase the delay amount of the variable delay circuit in a case where the timing of the second clock is deviated in the faster direction from the target timing.

11. The semiconductor integrated circuit according to claim 1,
wherein the delay adjustment circuit is configured to determine that the timing of the second clock is deviated in a slower direction from the target timing in a case where a combination of the sampling result by the edge sampler and the sampling result by the data sampler matches at least a first pattern, and determine that the timing of the second clock is deviated in a faster direction from the target timing in a case where the combination matches a second pattern different from the first pattern.

12. The semiconductor integrated circuit according to claim 11,
wherein the delay adjustment circuit is configured to decrease the delay amount of the variable delay circuit in a case where the timing of the second clock is deviated in a slower direction from the target timing, and increase the delay amount of the variable delay circuit in a case where the timing of the second clock is deviated in a faster direction from the target timing.

13. The semiconductor integrated circuit according to claim 1, wherein the correction circuit further includes a first feedback node to which the sampling result by the edge sampler is fed back, and a second feedback node to which the sampling result by the data sampler is fed back.

14. The semiconductor integrated circuit according to claim 1, wherein the equalizer circuit further comprises a delay circuit that is electrically connected to the adjustment circuit, and the adjustment circuit performs, by using a delayed clock supplied from the delay circuit, sampling of the values in the edge periods of the data output from the summer circuit.

15. The semiconductor integrated circuit according to claim 14, wherein the delay circuit includes a fixed delay amount.

16. A reception device comprising: the semiconductor integrated circuit according to claim 1; and a circuit configured to receive data output from the semiconductor integrated circuit.

17. The reception device according to claim 16, wherein the adjustment circuit is configured to determine whether the timing of the second clock is deviated in a slower direction or a faster direction from the target timing according to the sampling results, and adjust the delay amount of the variable delay circuit according to a result of the determination.

18. The reception device according to claim 16, wherein the equalizer circuit further comprises a delay circuit that is electrically connected to the adjustment circuit, and the adjustment circuit performs, by using a delayed clock supplied from the delay circuit, sampling of the values in the edge periods of the data output from the summer circuit.

* * * * *